(12) United States Patent
Shimizu et al.

(10) Patent No.: US 6,612,231 B2
(45) Date of Patent: Sep. 2, 2003

(54) SQUEEGEE FOR SCREEN PRINTING, AND SQUEEGEE DEVICE EQUIPPED WITH THE SQUEEGEE

(75) Inventors: Toshinori Shimizu, Kariya (JP); Manabu Mizuno, Toyota (JP); Jun Adachi, Nagoya (JP); Mamoru Tsuda, Okazaki (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 10/003,427

(22) Filed: Dec. 6, 2001

(65) Prior Publication Data

US 2002/0056379 A1 May 16, 2002

(30) Foreign Application Priority Data

Dec. 8, 2000 (JP) .......................................... 2000-374936

(51) Int. Cl.<sup>7</sup> ........................... B41F 15/42; B41L 13/18
(52) U.S. Cl. ...................................... 101/123; 101/114
(58) Field of Search ............................... 101/123, 124, 101/126, 167, 169, 114, 363, 364, 365; 118/213, 301, 406

(56) References Cited

U.S. PATENT DOCUMENTS 4,078,486 A  *  3/1978  Moser ......................... 101/120
4,393,775 A  *  7/1983  Cappel et al. ............... 101/365
4,622,239 A     11/1986  Schoenthaler et al. ........ 427/96
5,715,748 A  *  2/1998  Murakami et al. ........... 101/114

FOREIGN PATENT DOCUMENTS

| GB | 2 021 043 A | * | 11/1979 |
| JP | A 4-284249 | | 10/1992 |
| JP | A 8-48024 | | 2/1996 |
| JP | A 9-39214 | | 2/1997 |

* cited by examiner

Primary Examiner—Leslie J. Evanisko
(74) Attorney, Agent, or Firm—Oliff & Berridge, PLC

(57) ABSTRACT

A squeegee for forcing a print material into apertures of a mask screen which is disposed on an object, so as to print the print material on the object. The squeegee includes: (a) a plate body movable relative to the mask screen in sliding contact thereof with one of opposite surfaces of the mask screen which is remote from the object, while taking a rearward inclined posture in which the plate body is inclined such that a distal end portion of the plate body is positioned on a forward side of a proximal end portion of the plate body as viewed in a squeegee moving direction in which the plate body is moved relative to the mask screen; and (b) a bank portion provided on one of opposite surfaces of the plate body which is remote from the mask screen, and having a blocking surface which projects from the distal end portion of the plate body in a direction away from the mask screen. The bank portion is made of a material softer than a material of the plate body.

15 Claims, 4 Drawing Sheets

SQUEEGEE FOR SCREEN PRINTING, AND SQUEEGEE DEVICE EQUIPPED WITH THE SQUEEGEE

BACKGROUND OF THE INVENTION

1. Field of the Invention

The present invention relates in general to a squeegee for use in a screen printing, and also to a squeegee device equipped with the squeegee.

2. Discussion of Related Art

In an operation with a screen printing machine, a print material is provided to be put on a surface of a mask screen which has print holes or apertures and which is placed on an object such as a board for providing a printed circuit board. A plate-like squeegee is slidably moved on the surface of the mask screen while the squeegee is held by a squeegee holding device in a forward tilted or inclined posture, i.e., in such a manner that the squeegee is inclined such that a distal free end portion of the squeegee is positioned on a rear side of a proximal end portion of the squeegee as viewed in a printing direction in which the squeegee is moved relative to the mask screen. With the sliding movement of the squeegee on the surface of the mask screen, the surface of the mask screen is wiped by the squeegee, namely, the print material arranged substantially in a line on the mask screen is carried or raked by the squeegee, so as to be forced or squeezed into the print apertures of the mask screen. The squeegee is commonly made of a rubber material having a high degree of elastic deformability which permits the squeegee to be held in close contact with the mask screen during the sliding movement, without separation of the squeegee from the mask screen even if a force acts on the squeegee in a direction away from the mask screen, so that the print material is reliably raked by the squeegee. That is, the rubber-made squeegee is held in close contact with the mask screen owing to the elastic deformation in its entirety, particularly, in its free distal end portion. Even in presence of the force acting on the squeegee in the direction away from the mask screen, the distal end portion of the squeegee is not separated from the mask screen, since the acting force causes simply a reduction in amount of the elastic deformation of the squeegee. However, the distal end portion of such a rubber-made squeegee having a high degree of elastic deformability tends to enter or bite into the apertures of the mask screen, so that the print material once received in the apertures is likely to be forced out of the apertures. Thus, the use of the rubber-made squeegee is likely to cause a problem that a sufficient amount of the print material is not printed on a print surface of the object, or a problem that the print material printed on the print surface of the object is not formed into a pattern corresponding to arrangement of the apertures.

The rubber-made squeegee may be replaced with a squeegee made of a metallic material which is more rigid or harder than a rubber material, for avoiding entrance or biting of a local part of the distal end portion of the squeegee into the apertures of the mask screen, so as to prevent the print material received in the apertures from being forced out of the apertures. Thus, owing to the use of the metallic squeegee, a desired amount of the print material is printed on the print surface of the object, and the print material printed on the print surface is accordingly formed into a desired pattern. However, the metallic squeegee is likely to be displaced in a direction away from the mask screen by a reaction force of the mask screen, so as to be easily separated from the mask screen. Due to the separation of the squeegee from the mask screen, the surface of the mask screen is not sufficiently wiped by the squeegee, so that some of the print material is left behind the squeegee, without being raked by the squeegee. While the above-described rubber-made squeegee can be elastically deformed particularly in its local portion, i.e., the distal end portion in which the squeegee is held in contact with mask screen, the metallic squeegee can not be locally deformed although the metallic squeegee has some degree of flexibility so as to be brought into contact with the mask screen with being somewhat bent in its entirety. Therefore, if a force acts on the metallic squeegee in a direction away from the mask screen, the metallic squeegee is undesirably separated from the mask screen, unlike the rubber-made squeegee which maintains its close contact with the mask screen owing to the sufficient amount of the elastic deformation of its distal end portion.

For solving the drawback indicated above, it is considered possible, for example, to adapt the squeegee to be slidably moved on the surface of the mask screen while the squeegee is held by the squeegee holding device in a rearward tilted or inclined posture, i.e., in such a manner that the distal end portion of the squeegee is positioned on a forward side of the proximal end portion of the squeegee as viewed in the printing direction in which the squeegee is moved relative to the mask screen. In this arrangement in which the distal end portion of the squeegee is constantly forced onto the mask screen during the sliding movement of the squeegee relative to the mask screen, the squeegee can be held in close contact with the mask screen even where the squeegee is made of a metallic material or other hard material. That is, in this arrangement, the metallic squeegee is not separated from the mask screen even when a reaction force is applied to the metallic squeegee from the mask screen, so that the metallic squeegee exhibits a satisfactory performance of raking the print material from the surface of the mask screen. Further, even in this arrangement in which the distal end portion of the squeegee is constantly forced onto the mask screen, the metallic squeegee which has a higher degree of hardness than the rubber-made squeegee does not allow considerable deformation of a local part of its distal end portion, and accordingly does not enter or bite into the apertures of the mask screen, whereby the print material once received in the apertures is prevented from being forced out of the apertures, leading to stable distribution of a sufficient amount of the print material into each of the apertures, and the consequently stable printing of the print material on the print surface of the object.

It is possible to adapt the squeegee to be elastically deformed in its entirety to be convexed toward the mask screen so as to be held in close contact at a larger area of its distal end portion with the mask screen, by increasing the degree of elastic deformability of the squeegee, for example, with an increase in the width of the squeegee, i.e., with an increase in the dimension of the squeegee in the printing direction. However, if the width of the squeegee is increased, the print material is likely to be mounted on the squeegee during the sliding movement of the squeegee on the surface of the mask screen. The print material mounted on the squeegee is eventually solidified without being received into the print apertures of the mask screen, thereby possibly producing a defectively printed product. That is, if the solidified print material is dropped from the squeegee onto unsolidified print material remaining on the mask screen, the solidified print material is mixed with the unsolidified print material, and the mixture is then forced into the apertures of the mask screen. The apertures are inevitably clogged with the mixture including the solidified print material, so that the print material is not allowed to be passed through the apertures so as to be printed on the object. This problem is encountered also in an arrangement in which the print material is accommodated in a space between a pair of squeegees such that the accommodated print material is moved together with the pair of squeegees while being raked by one of the squeegees which takes a rearward inclined posture.

SUMMARY OF THE INVENTION

It is an object of the present invention to provide a squeegee or squeegee device which is capable of efficiently raking a print material from a surface of a mask screen with minimized risk of biting of a distal end portion of the squeegee into print apertures of the mask screen, for thereby exhibiting an improved stability in a screen printing operation without producing a defectively printed product.

The above object may be achieved according to any one of the following modes of the present invention, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A squeegee for forcing a print material into apertures of a mask screen which is disposed on an object, so as to print the print material on the object, the squeegee comprising: (a) a plate body movable relative to the mask screen in sliding contact thereof with one of opposite surfaces of the mask screen which is remote from the object, while taking a rearward inclined posture in which the plate body is inclined such that a distal end portion of the plate body is positioned on a forward side of a proximal end portion of the plate body as viewed in a squeegee moving direction in which the plate body is moved relative to the mask screen; and (b) a bank portion provided on one of opposite surfaces of the plate body which is remote from the mask screen, and having a blocking surface which projects from the distal end portion of the plate body in a direction away from the mask screen, the bank portion being made of a material softer than a material of the plate body.

The above-described object, on which the print material to be printed, may be a substrate or board for providing a printed board in the form of a printed circuit board. The object may be a board which does not have any electric component mounted on the board, or may be a board which has some electric components mounted only on a surface opposite to a print surface. The print material may be an adhesive, a creamed solder or an ink, or alternatively a paste or other highly viscous fluid which does not include a solder component and which is to be applied to the board for facilitating a soldering operation. The mask screen may consist of a masking member made of a fiber material, a masking member principally made of a fiber material and reinforced by a metallic material, or a masking member made of a metallic material and commonly called as "stencil mask". Either one of the plate body of the squeegee and the mask screen may be moved while the other of the plate body and the mask screen may be held stationary, or alternatively, the plate body and the mask screen may be moved in the respective directions which are opposite to each other. The bank portion may be simply held in close contact with the surface of the plate body, or alternatively may be fixed to the surface of the plate body by suitable fixing means. While the plate body of the squeegee is required to take the above-described rearward inclined posture at least during its sliding movement on the surface of the mask screen, the plate body may take other posture except during the sliding movement.

In the squeegee constructed according to this mode (1), the distal end portion of the plate body is held in contact with the mask screen in an elastic manner owing to the rearward inclined posture during a printing operation. By the sliding movement of the plate body and the mask screen relative to each other, the print material is pushed principally by the bank portion, and is also wiped or raked from the mask screen by the distal end portion of the plate body, so that the print material is squeezed or forced into the print holes or apertures. The distal end portion of the plate body thus serves to move the print material together with the plate body, and also serves to force the print material into the print apertures. The rearward inclined posture of the plate body which is maintained during the sliding movement is effective to enable the plate body to rake and carry the print material with high efficiency. Further, since the plate body is made of a comparatively rigid or hard material such as a metallic material as in the below-described (3), the distal end portion of the plate body does not enter or bite into the print apertures of the mask screen, so that the print material is prevented from being forced out of the apertures. Thus, a desired amount of the print material is printed on the print surface of the object, and the print material printed on the print surface is accordingly formed into a desired pattern corresponding to arrangement of the apertures. Further, the blocking surface provided in the distal end portion of the plate body serves to block the print material, preventing the print material to be mounted on the plate body. Since the bank portion having the blocking surface is made of a material softer than that of the plate body, the bank portion does not impede the elastic deformation of the plate body, permitting the distal end portion of the plate body to be brought into close contact with the mask screen so as to rake the print material from the mask screen. Consequently, the squeegee constructed according to this mode (1) is capable of efficiently raking the print material and accordingly achieving a screen printing operation with an improved stability, without causing a defective printing due to mounting of the print material on the plate body.

(2) A squeegee according to mode (1), wherein the bank portion has a blocking wall which projects from the distal end portion of the plate body in a direction away from the mask screen, and wherein the blocking surface is provided by a surface of the blocking wall.

The bank portion may be provided by a thick plate member which has a larger thickness than that of the plate body and which is superposed on and bonded to the one of the opposite surfaces of the plate body that is remote from the mask screen, so that the blocking surface is provided by a front end surface of the thick plate member. However, it is preferable that the blocking surface is provided by the front surface of the blocking wall as in the arrangement according to this mode (2), because the bank portion is elastically deformable more easily where the bank portion is principally provided by the wall than where the bank portion is provided by the thick plate member. The higher degree of elastic deformability of the bank portion facilitates the elastic deform of the plate body, thereby making it possible to bring the plate body into brought into close contact at a lager area of its distal end portion with the mask screen, and accordingly to permit the plate body to rake the print material from the surface of the mask screen with a higher efficiency. The arrangement of this mode (2) provides another advantage that the manufacturing cost of the squeegee can be reduced since the bank portion can be formed of a reduced amount of material.

(3) A squeegee according to mode (1) or (2), wherein the plate body is made of a metallic material.

In the squeegee constructed according to this mode (3) in which the plate body is made of a metallic material, the plate body is so hard that the distal end portion of the plate body is reliably prevented from entering or bite into the apertures of the mask screen. It is noted that the metallic plate body can be formed of a spring steel, a phosphor bronze or other material which has a suitable degree of elastic deformability or unbrittleness required for the plate body to be elastically deformable without risk of its fracture even where the plate body has a considerably reduced thickness, and also a suitable degree of hardness required for the plate body to satisfactorily rake the print material.

(4) A squeegee according to any one of modes (1)–(3), wherein the bank portion is made of a rubber.

(5) A squeegee according to any one of modes (1)–(3), wherein the bank portion is made of a material having substantially the same degree of elastic deformability as that of a rubber.

In the squeegee constructed according to each of modes (4) and (5), the bank portion is elastically further deformable, permitting the plate body to be elastically further deformable and thereby further facilitating the close contact of the distal end portion of the plate body with the surface of the mask screen. It is noted that there is known a soft synthetic resin as a material having the same degree of elastic deformability as that of a rubber.

(6) A squeegee device comprising: (a) the squeegee defined in mode (1); (b) a squeegee holder which holds the squeegee such that the other of the opposite surfaces of the plate body cooperates with the one of the opposite surfaces of the mask screen to define an angle not lager than 45°, and such that the blocking surface of the bank portion cooperates with the above-described one of the opposite surfaces of the mask screen to define an angle not larger than 90°; and (c) a moving device which is capable of moving the squeegee holder and the mask screen relative to each other while maintaining contact of the squeegee with the one of the opposite surfaces of the mask screen.

The angle defined by the surface of the plate body and the surface of the mask screen is preferably not larger than 45°, more preferably not larger than 30°, still more preferably not larger than 20°. In a printing operation with the squeegee device constructed according to this mode (6), the print material is first disposed on the mask screen so as to be exposed to the atmosphere (ambient space), and the print material is then carried by the squeegee when the squeegee is slidably moved on the mask screen. The carried print material is squeezed or forced into the print apertures, so as to be printed on the print surface of the object. In the squeegee of this mode (6) in which the blocking surface provided by the front surface of the bank portion is held in a forward tilted or inclined posture while the plate body is held in a rearward tilted or inclined posture, during the movement of the squeegee holder and the mask screen relative to each other, the print material is raked from the surface of the mask screen by the distal end portion of the plate body, and the print material is then forced into a wedge-shaped space which is defined by the blocking surface and the surface of the mask screen. The print material displaced into the wedge-shaped space is forced, toward the mask screen, by the blocking surface which cooperates with the surface of the mask screen to define an acute angle, i.e., an angle not larger than 90°. It is possible to further reduce the risk of biting of the distal end portion of the plate body into the apertures of the mask screen, by reducing the angle defined by the surface of the plate body and the surface of the mask screen. That is, it is possible to further reliably prevent the print material received in the apertures from being forced out of the apertures, with the reduction in the angle between the surface of the plate body and the surface of the mask screen.

(7) A squeegee device according to mode (6), further comprising a second moving device in addition to the moving device as a first moving device, the second moving device being capable of moving the squeegee holder between an operating position in which the squeegee is brought into contact with the above-described one of the opposite surfaces of the mask screen, and a non-operating position in which the squeegee is separated from the one of the opposite surfaces of the mask screen.

(8) A squeegee device according to mode (6) or (7), wherein the squeegee holder includes: a squeegee holding portion which holds the proximal end portion of the plate body; and a print-material pushing portion which is held in close contact with one of opposite ends of the bank portion that is remote from the plate body, and which has a print-material pushing surface that is contiguous to the blocking surface of the bank portion.

The pushing portion may be fixed to the end of the bank portion by an adhesive or other suitable means, or alternatively may be simply held in close contact with the end of the bank portion, without being fixed to the end of the bank portion. The pushing surface serves to push and move the print material along the surface of the mask screen. There is a case where the pushing surface also serves to force the print material into the apertures of the mask screen. In the squeegee device according to this mode (8) in which the pushing portion is held in close contact with the end of the bank portion, there is substantially no gap between the pushing portion and the end of the bank portion, through which the print material would be displaced onto the plate body. Thus, the print material is further reliably prevented from being mounted onto the plate body.

(9) A squeegee device according to any one of modes (6)–(8), wherein the bank portion of the squeegee has a blocking wall which projects from the distal end portion of the plate body in a direction away from the mask screen, and which has a surface forming the blocking surface, wherein the squeegee holder includes: a first member including a plate portion extending substantially in parallel with the plate body, and a plate-body seat portion projecting from one of opposite end portions of the plate portion, which one is positioned rearward of the other of the opposite end portions of the plate portion as viewed in the squeegee moving direction, toward the mask screen; and a second member which is removably attached to the first member and which cooperates with the first member to grip the proximal end portion of the plate body, wherein the plate portion of the first member is held in close contact at the other of the opposite end portions of the plate portion with an end portion of the blocking wall, while the proximal end portion of the plate body is gripped between the first and second members, and wherein the plate body, the blocking wall and the plate portion cooperate with the plate-body seat portion to constitute a hollow body which has a square shape in a cross section thereof.

The blocking wall may be fixed to the plate body by a welding, adhesive or other suitable means, or alternatively may be simply held in close contact with the plate body, without being fixed to the plate body. Similarly, the end portion of the plate portion of the first member may be fixed to the blocking wall, or alternatively may be simply held in close contact with the blocking wall, without being fixed to the blocking wall. In the squeegee device according to this mode (9) in which a void or space is formed on one of opposite sides of the plate body that is remote from the mask screen, the elastic deformation of the plate body is facilitated by this void or space, whereby the distal end portion of the plate body can be further reliably held in close contact with the mask screen, while the print material is prevented from being mounted onto the plate body.

(10) A squeegee device according to mode (9), wherein the squeegee holder further includes a third member which holds the first member and is held in close contact with one of opposite surfaces of the plate portion that is remote from the blocking wall, and wherein the third member cooperates with the first member to form a pushing surface that is adjacent to the blocking surface of the bank portion.

The third member may be fixed to the surface of the plate portion, or alternatively may be simply held in closed contact with the surface of the plate portion, without being fixed to the surface of the plate portion.

(11) A squeegee device comprising: (a) a pair of squeegees each of which is constituted by the squeegee defined in mode (1); (b) a squeegee holder which holds the pair of squeegees such that the blocking surfaces of the respective squeegees are opposed and parallel to each other, and such that the other of the opposite surfaces of the plate body of each of the pair of squeegees cooperates with the one of the opposite surfaces of the mask screen to define an angle not lager than 45°; and (b) a moving device which is capable of reciprocating the squeegee holder and the mask screen relative to each other in directions perpendicular to the blocking surfaces of the respective squeegees, while maintaining contact of each of the pair of squeegees with the above-described one of the opposite surfaces of the mask screen.

In the squeegee device of this mode (11), the printing material may be accommodated in a space between the pair of squeegees, and the accommodated print material is raked and moved with the movement of the pair of squeegees, so that a part of the print material corresponding to each of the apertures is forced into the aperture. During the reciprocation of the squeegee holder and the mask screen relative to each other, a rear side one of the squeegees, as viewed in a direction in which the pair of squeegees and the mask screen are currently moved relative to each other, serves to rake the print material, while a forward side one of the squeegees serves to prevent outflow of the print material from the space between the pair of squeegees. That is, the function of each of the pair of squeegees is changed each time the printing direction is changed. Thus, during the relative movement in both of the opposite directions, the print material is moved together with the squeegees while being raked from the mask screen, so that a part of the print material, which corresponds to each of the apertures, is forced into the aperture so as to be printed on the object. The above-described rear side one of the squeegees which serves to rake the print material takes a reward inclined posture, so that the plate body efficiently rakes the print material without entering or biting into the apertures while the bank portion prevents the print material from being mounted onto the plate body, for thereby achieving a print operation with high stability without causing a defective printing.

(12) A squeegee device according to mode (11), further comprising a pressure applying device capable of applying a pressure to the print material which is accommodated in a space between the blocking surfaces of the respective squeegees.

The pressure applying device, for example, may consist of a device which includes an extruding-member driving device for mechanically driving an extruding member so as to apply the pressure to the print material accommodated in above-described space, or alternatively may consist of a device which includes a pressurized-air supplying device for supplying a pressurized air to an upper portion of the space so as to apply the pressure to the print material.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
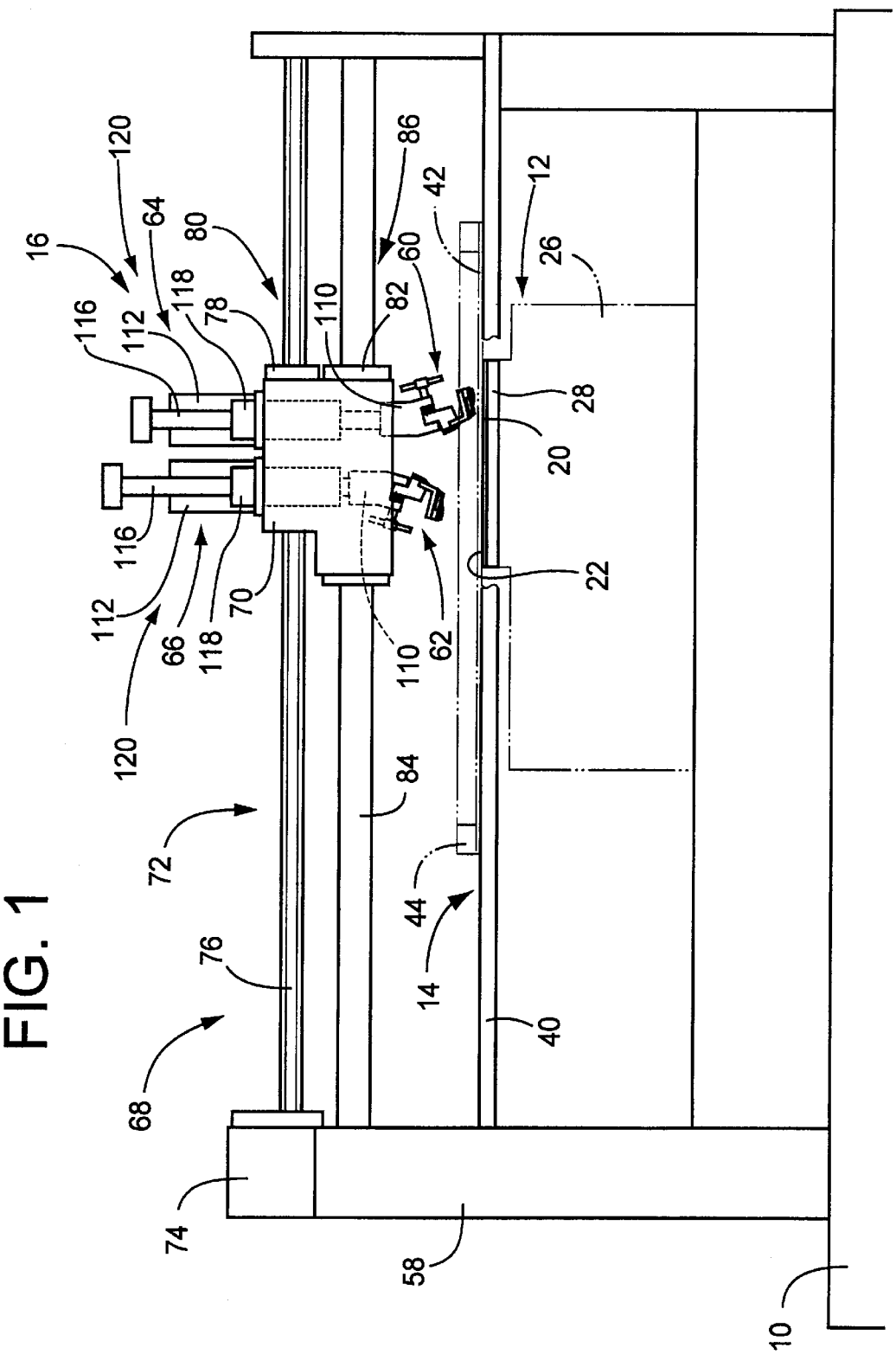
FIG. 1 is a front view schematically showing a screen printing machine equipped with a squeegee device which is constructed according to one embodiment of this invention.

Referring first to FIG. 1, there will be described a screen printing machine which is equipped with a squeegee and a squeegee device constructed according to a first embodiment of this invention. The screen printing machine includes a board positioning device 12, a mask-screen positioning device 14 and a squeegee device 16 which are mounted on a base 10.

The board positioning device 12 serves to position and hold an object in the form of a substrate or board 20 for providing a printed circuit board. That is, the board positioning device 12 holds the board 20 in a predetermined position, which board has been carried or loaded onto the screen printing machine by a board loading apparatus (not shown). In the present embodiment, the board loading apparatus is adapted to carry the board 20 in a horizontal direction, i.e., in the right and left directions as viewed in FIG. 1 which are parallel to X-axis direction of the screen printing machine. While the board 20 is being carried by the board loading apparatus, the board 20 is held by the screen printing machine in its horizontal posture, i.e., in such a manner that a print surface 22 on which a print material in the form of a creamed solder is to be printed is faced upwardly.

The board positioning device 12 includes an elevating and lowering device 26, and a board supporting table 28 which is elevated and lowered by the elevating and lowering device 26. The board 20, which has been loaded onto the screen printing machine by the board loading apparatus, is stopped by a board stopping device (not shown), and is then positioned on an upper surface of the board supporting table 28 by positioning pins or other suitable positioning means. The board 20 is sucked, at its one of opposite surfaces that is opposite to the print surface 22, by the board supporting table 28 with a vacuum pressure applied to the board 20, while being gripped by and between the table 28 and a board holding plate member (not shown) disposed above the table 28. The board 20, which is thus sucked and held by the board supporting table 28 in a horizontal posture, is elevated to a printing position in which the creamed solder is to be printed on the print surface 22. It is noted that the board holding plate member is retreated from the board 20, after the board 20 has been sucked by the board supporting table 28 and before the board 20 is elevated together with the board supporting 28 by the elevating and lowering device 26. The elevating and lowering device 26 can be referred to as an object elevating and lowering device for elevating and lowering the board 20, and also to as an approaching and separating device for bringing the print surface 22 of the board 20 into proximity with a mask screen 42 and separating the print surface 22 of the board 20 from the mask screen 42.

The mask-screen positioning device 14 includes a mask supporting table 40 which consists of a rectangular frame body and which is adapted to support the mask screen 42 and a holding frame 44 fixed to a periphery of the mask screen 42. The holding frame 44 is fixed to the mask supporting table 44 by a fixing device (not shown) with being held in its horizontal posture, and is positioned in the X-axis direction and Y-axis direction by a X-axis direction positioning device and a Y-axis direction positioning device (not shown), respectively. It is noted that the Y-axis direction is perpendicular to the X-axis direction in a horizontal plane, namely, perpendicular to the drawing sheet of FIG. 1.

Figure 2:
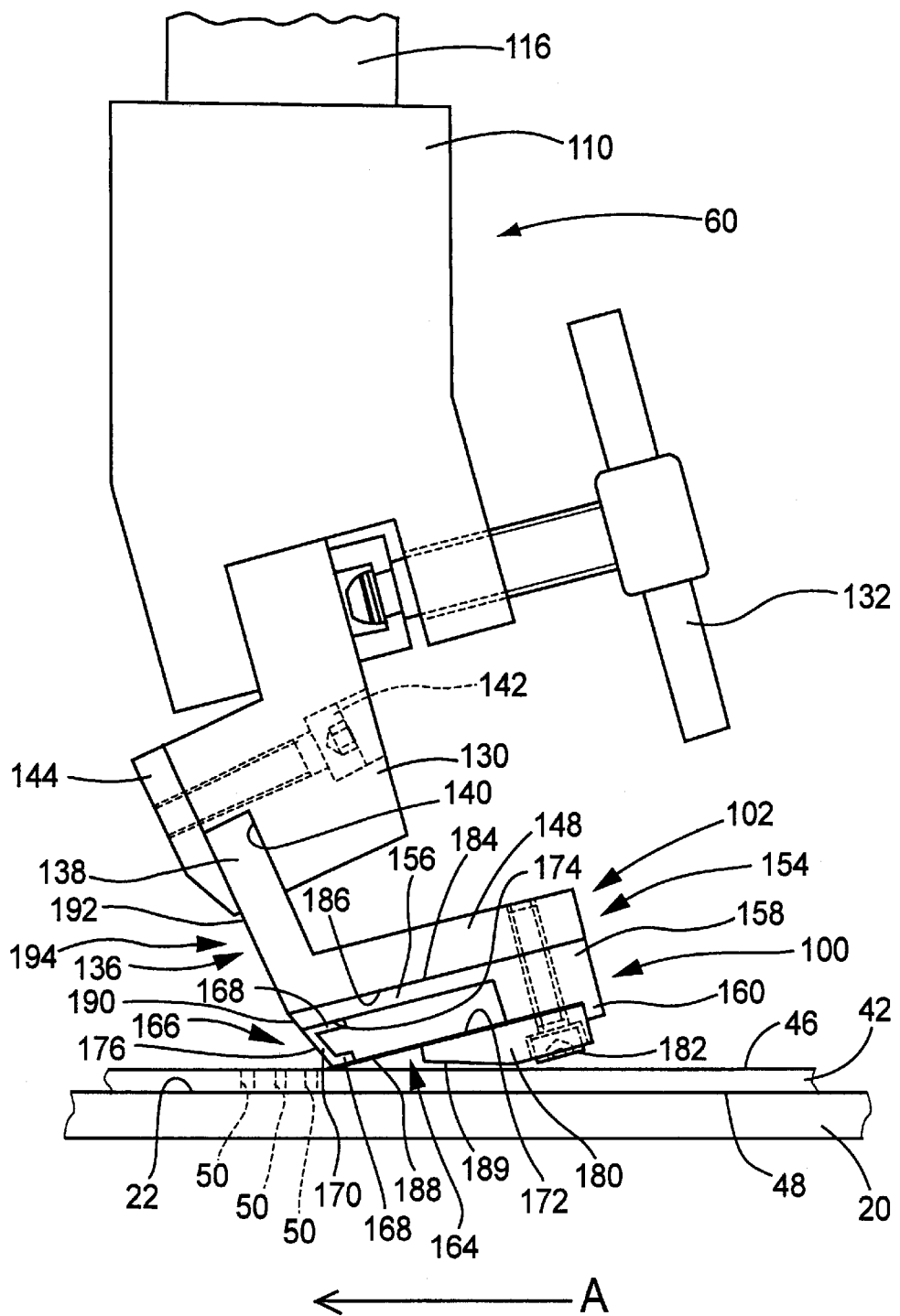
FIG. 2 is a front view showing a squeegee and a squeegee holder of the squeegee device of FIG. 1.
Figure 3:
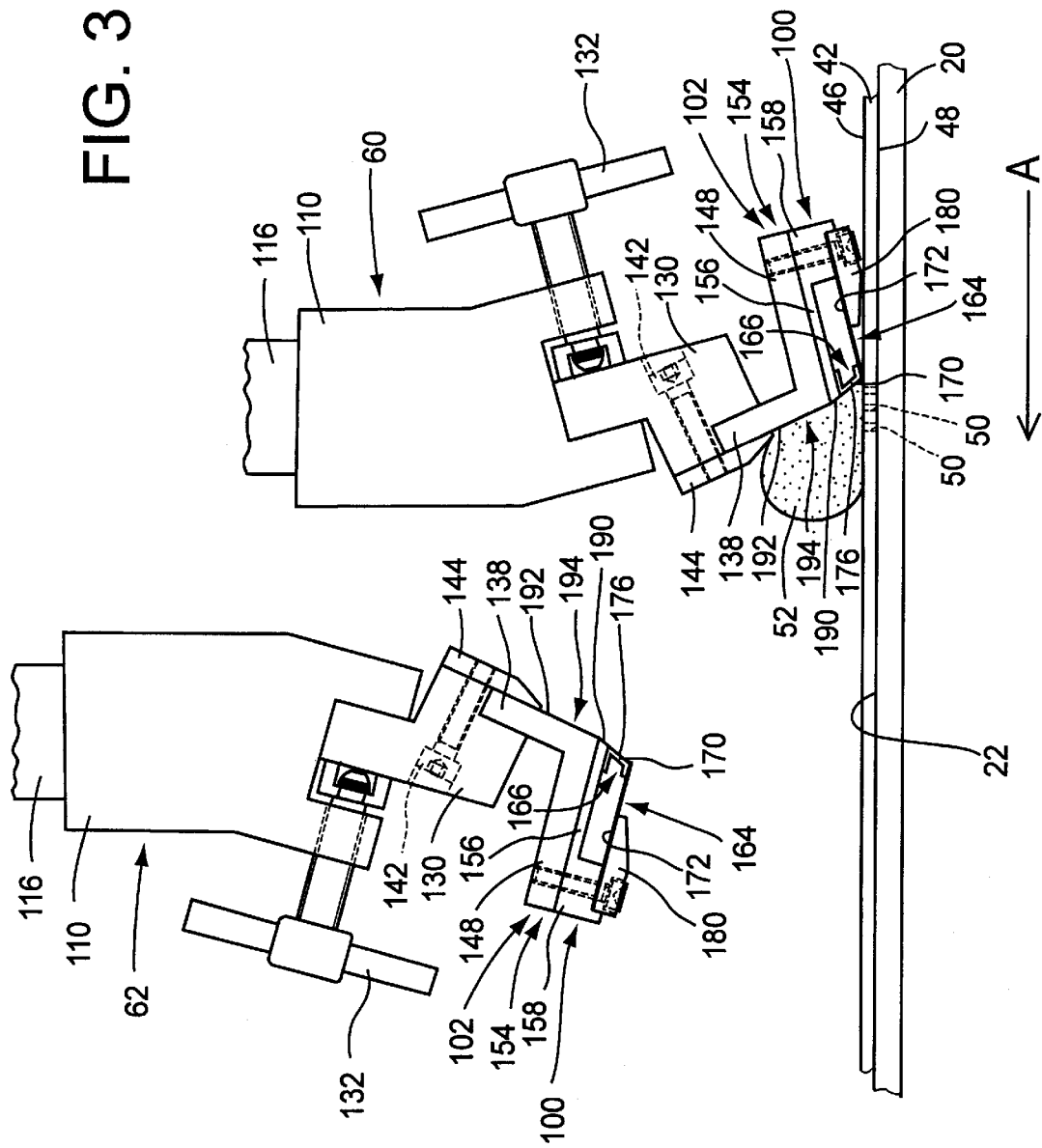
FIG. 3 is a view for explaining a printing operation with the squeegee device of FIG. 1, in which a creamed solder is printed on an object in the form of a board for providing a printed circuit board.

The mask screen 42 consists of a so-called "stencil mask" which is made of a metallic material such as a nickel alloy and a stainless steel. The mask screen 42 has a substantially rectangular shape, and is supported by the mask supporting table 40 in such a manner that the mask screen 42 is elongated in the X-axis direction rather than in the Y-axis direction. As shown in FIG. 2, the mask screen 42 has a plurality of print holes or apertures 50 each of which is open in both of its upper surface 46 and lower surface 48 that is opposed to the print surface 22 of the board 20. The apertures 50 are arranged in accordance with a desired pattern which is to be described on the print surface 22 by a print material. The print material in the form of a creamed solder 52 is provided on the upper surface 46 of the mask screen 42, and is forced through the print apertures 50 so as to be printed on the print surface 22 of the board 20, as shown in FIG. 3.

The squeegee 16 is provided in a main frame 58 which is fixed to the base 10, as shown in FIG. 1. The squeegee device 16 includes: a pair of squeegee heads 60, 62; a second moving device in the form of a pair of vertical movement devices 64, 66 for elevating and lowering the respective squeegee heads 60, 62; and a first moving device in the form of a horizontal movement device 68 for moving the squeegee heads 60, 62 together with each other in a horizontal direction.

The horizontal movement device 68 includes: a movable member in the from of a slide 70 which consists of an elongated member elongated in the Y-axis direction; and an X-axis movement device 72 for reciprocating the slide 70 in the X-axis direction. The X-axis movement device 72 includes: a servomotor 74 as a drive source; and a motion converting device 80 principally constituted by a feed screw 76 and a nut 78 which are engaged to each other. The feed screw 76 is supported by the main frame 58 in such a manner that the feed screw 76 is unmovable in the axial direction and rotatable relative to the main frame 58, while the nut 78 is fixed to an longitudinal end portion of the slide 70. The rotation of the servomotor 74 is converted by the motion converting device 80, into a linear movement of the slide 70 in the X-axis direction. The linear movement of the slide 70 is guided by a guide device 86 which includes: a guiding member in the form of a pair of guide rails 84 which are fixed to the main frame 58; and a guided member in the from of a pair of guide blocks 82 which are provided in the respective longitudinal end portions of the slide 70 and which are slidably engaged to the respective guide rails 84. It is noted that only one of the pair of guide rails 84 and only one of the pair of guide blocks 82 are shown in FIG. 1. The servomotor 74, whose rotational angle and speed are accurately controllable, is a kind of electrically rotated motor as an electric motor. While the drive source takes the form of the servomotor 74 in the present embodiment, the drive source may be provided by a stepping motor in place of the servomotor 74.

The above-described pair of squeegee heads 60, 62 and vertical movement devices 64, 66 are provided in the slide 70, and are movable together with the slide 70 in the X-axis direction. In the present embodiment, the X-axis direction corresponds to a squeegee moving direction or a screen printing direction, while the Y-axis direction corresponds to a width direction of the mask screen 42. The squeegee heads 60, 62 are arranged symmetrically with each other with respect to a plane which is perpendicular to the upper surface 46 of the mask screen 42 and which is perpendicular to the X-axis direction, i.e., the squeegee moving direction. Since the squeegee heads 60, 62 are identical in construction with each other, only the squeegee head 60 will be described below in detail.

The squeegee head 60 includes a squeegee 100 and a squeegee holder 102 for holding the squeegee 100, as shown in FIG. 2. The squeegee head 60 is elevated and lowered by the vertical movement device 64 which includes a vertically movable member 110 and a cylinder 112. The cylinder 112 is provided in a longitudinally intermediate portion of the slide 70 in such a manner that a piston rod (not shown) of the cylinder 112 is extensible downwardly, i.e., in a direction toward the mask screen 42. The vertically movable member 110 consists of an elongated member elongated in the Y-axis direction, and is connected in its longitudinally intermediate portion to the piston rod of the cylinder 112. A pair of guide rods 116 is provided to be connected to respective opposite sides of the longitudinally intermediate portion of the vertically movable member 110. The guide rods 116 extend in the vertical direction, and are slidably fitted in respective guide sleeves 118 which are fixed to the slide 70 and which also extend in the vertical direction, so that each of the guide rods 116 is movable relative to the corresponding one of the guide sleeves 118 in the vertical direction. With extension and retraction of the piston rod of the cylinder 112, the vertically movable member 110 is lowered and elevated while being guided by a guide device 120 which is provided by the guide rod 116 and the guide sleeve 118. While the cylinder 112 consists of an air cylinder in the present embodiment, the cylinder 112 may consist of a hydraulic cylinder or other actuator which is to be activated by a pressurized fluid. While the single cylinder 112 is provided in the slide 70 in the present embodiment, a plurality of cylinders, e.g., two cylinders may be provided to be arranged in the Y-axis direction such that the two cylinders are activated in a synchronized manner for elevating and lowering the vertically movable member 110.

The squeegee holder 102 is removably attached to the vertically movable member 110. With the vertical movement of the vertically movable member 110, the squeegee holder 102 is moved between its lowered position, i.e., an operating position in which the squeegee 100 is brought into contact with the mask screen 42, and its elevated position, i.e., a non-operating position in which the squeegee 100 is separated from the mask screen 42. To the vertically movable member 110, a first attachment 130 is removably attached by clamping means in the form of a clamping bolt 132. The first attachment 130 consists of an elongated member elongated in the Y-axis direction, and is held by the vertically movable member 110 in a forward tilted or inclined posture, i.e., in such a manner that the first attachment 130 is inclined such that a distal end portion of the first attachment 130 is positioned on a rear side of a proximal end portion of the first attachment 130 as viewed in a squeegee moving direction (as indicated by the arrow A in FIG. 1) in which the squeegee heads 60, 62 are moved relative to the mask screen 42 when a screen printing is carried out by the squeegee head 60. In other words, the first attachment 130 held by the vertically movable member 110 is inclined such that a rear portion of the first attachment 130 as viewed in the above-described squeegee moving direction is relatively close to the mask screen 42 while a forward portion of the first attachment 130 is relatively distant from the mask screen 42. It is noted that the squeegee heads 60, 62 are moved relative to the mask screen 42 in another squeegee moving direction which is opposite to the above-described squeegee moving direction, when a screen printing is carried out by the squeegee head 62.

To the first attachment 130, a second attachment 136 is removably attached. The second attachment 136 also consists of an elongated member, and is attached to the first attachment 130 such that the second attachment 136 is elongated in the Y-axis direction. The second attachment 136 has a generally L shape in its transverse cross section, and is principally constituted by two arm portions 138, 148 which cooperate with each other to provide the L shape in the transverse cross section. The arm portion 138 is received in a cutout 140 which is formed in the first attachment 130, and is gripped by and between the first attachment 130 and a retainer plate 144 which is removably fixed to the first attachment 130 by fixing means in the form of a fixing bolt 142. As is apparent from FIG. 2, the second attachment 136 is attached to the first attachment 130 in such a manner that the arm portion 138 received in the cutout 140 is held in a forward inclined posture while the arm portion 148 is held in a rearward inclined posture.

The squeegee 100 is held by a squeegee holding member 154, so as to be removably attached to the arm portion 148 of the second attachment 136. The squeegee holding member 154 consists of an elongated member which is elongated in the Y-axis direction. The squeegee holding member 154 includes a plate portion 156, and a plate-body seat portion 158 projecting downwardly from one of widthwise opposite end portions of the plate portion 156, which one is positioned rearwardly of the other widthwise end portion as viewed in the above-described squeegee moving direction. The squeegee holding member 154 further includes a positioning portion 160 projecting downwardly from one of widthwise opposite end portions of the plate-body seat portion 158, which one is positioned rearward of the other widthwise end portion as viewed in the squeegee moving direction. It is noted that the plate portion 156, plate-body seat portion 158 and positioning portion 160 are all elongated in the longitudinal direction of the squeegee holding member 154, i.e., in the Y-axis direction.

The squeegee 100 includes a plate body 164 and a bank member 166. The plate body 164 consists of a thin plate body which is elongated in the Y-axis direction and which is made of a metallic material, e.g., a spring steel so as to have a certain degree of elastic deformability. The bank member 166 consists of an elongated member which is elongated in the Y-axis direction and which is made of a rubber. The bank member 166 has a generally U shape in its transverse cross section, and includes a pair of side walls 168 and a blocking wall 170. The pair of side walls 168 are parallel to each other, and is connected at their respective widthwise ends to each other by the blocking wall 170.

The bank member 166 is positioned relative to the plate body 164 so as to be parallel to the longitudinal direction of the plate body 164. The bank member 166 is welded, bonded or otherwise fixed at one of the side walls 168 to a distal end portion (i.e., a forward end portion as viewed in the squeegee moving direction) of an upper surface 172 of the plate body 164. Further, the bank member 166 is welded, bonded or otherwise fixed also at the other of the side walls 168 to a distal end portion (i.e., a forward end portion as viewed in the squeegee moving direction) of a lower surface 174 of the plate portion 156 of the squeegee holding member 154. The bank member 166 is fixed to the plate body 164 and the squeegee holding member 154 such that a space surrounded or defined by the pair of side walls 168 and the blocking wall 170 is open in a direction opposite to the squeegee moving direction, and such that the blocking wall 170 extends upwardly from the distal end portion of the upper surface 172 of the plate body 164.

The blocking wall 170, extending upwardly from the distal end portion of the plate body 164, is inclined with respect to the plate body 164 such that the blocking wall 170 intersects with the plate body 164 at an obtuse angle, i.e., an angle larger than 90°. The blocking wall 170 has a blocking surface 176 which is provided by a front one of opposite surfaces of the blocking wall 170 as viewed in the squeegee moving direction.

The plate body 164 is gripped at its gripped portion by and between the plate-body seat portion 158 of the squeegee holding member 154 and a retainer plate 180 which also consists of an elongated member elongated in the Y-axis direction, such that the plate body 164 is fixed, together with the squeegee holding member 154 and the retainer plate 180, to the arm portion 148 of the second attachment 136 by a fixing bolt 182. The gripped portion of the plate body 164 is provided by the proximal end portion of the plate body 164, i.e., a rearward one of widthwise end portions of the plate body 164 that is other than the above-described forward end portion of the plate body 164 to which the bank member 166 is fixed. The plate body 164, which is gripped at its upper and lower surfaces 172, 188 in the gripped portion by and between the squeegee holding member 154 and the retainer plate 182, is fixed, together with the squeegee holding member 154 and the retainer plate 180, to the second attachment 136 by the fixing bolt 182, such that the longitudinal direction of each of the squeegee 100 and the squeegee holding member 154 is held in parallel to the Y-axis direction. In this arrangement, the plate portion 156 of the squeegee holding member 154 is held in close contact at its upper surface 184 with a lower surface 186 of the arm portion 148 of the second attachment 136. The retainer plate 180 is positioned by the positioning portion 160, in a predetermined position relative to the squeegee holding member 154 at least in the X-axis direction, and is removably attached to the squeegee holding member 154 by the fixing bolt 182. When the squeegee 100 required to be replaced with other squeegee, the squeegee holding member 154 is also replaced with other squeegee holding member. However, in this instance, the retainer plate 180 can be used also for the other squeegee and squeegee holding member, without being replaced with other retainer plate. That is, the same retainer plate 180 can be repeatedly used as a common retainer plate serving for a plurality of sets of squeegees and squeegee holding members.

The plate body 164 of the squeegee 100 is held in the rearward inclined posture, while being attached together with the squeegee holding member 154 to the second attachment 136 whose arm portion 148 is held in the rearward inclined posture. The plate body 164 is held in its proximal end portion by the plate-body seat portion 158 and the retainer plate 180, while at the same time the plate body 164 is held in an adjacent portion adjacent to the proximal end portion by a projecting portion of the retainer plate 180 which projects forwardly from the plate-body seat portion 158 and which is held in contact with the lower surface 188 of the retainer plate 180. While the proximal end portion and the adjacent portion of the plate body 164 are thus held by the plate-body seat portion 158 and the retainer plate 180, the distal end portion of the plate body 164 projects forwardly from the plate-body seat portion 158 so as to be elastically deformable. In the present embodiment, the plate body 164 is inclined at about 15° with respect to a horizontal plane which is parallel with the upper surface 46 of the mask screen 42, so that the lower surface 188 of the plate body 164 intersects with the upper surface 46 of the mask screen 42 at about 15° when the squeegee 100 is brought into contact with the upper surface 46 of the mask screen 42.

When the squeegee 100 is being gripped by and between the retainer plate 180 and the squeegee holding member 154 so as to be fixed relative to the second attachment 136, the plate portion 156 of the squeegee holding member 154 is held in parallel with the plate body 164 of the squeegee 100. Further, with the squeegee 100 being fixed relative to the second attachment 136, the plate portion 156 of the squeegee holding member 154 (to which the side wall 168 of the bank member 166 is fixed) is held in close contact at the distal end portion of the lower surface 174 with the upper end portion of the blocking wall 170. In this arrangement, the plate body 164, the blocking wall 170 and the plate portion 156 cooperate with the plate-body seat portion 158 to constitute a hollow body having an interior cavity which has a square shape in its transverse cross section. It is noted that the retainer plate 180 has in its lower surface a sloped portion 189 which is formed by removing a lower portion of the above-described projecting portion of the retainer plate 180. With the retainer plate 180 being fixed relative to the second attachment 136, the sloped portion 189 of the lower surface of the retainer plate 180 is held in substantially parallel with the upper surface 46 of the mask screen 41, so that the contact of the plate body 64 with the mask screen 42 is not impeded by the retainer plate 180, as shown in FIG. 2.

The blocking surface 176 of the blocking wall 170 projecting upwardly from the distal end portion of the plate body 164 intersects with the upper surface 172 of the plate body 164 at an obtuse angle, i.e., an angle larger than 90°. The blocking surface 176 takes a forward tilted or inclined posture so that an angle defined by the blocking surface 176 and the upper surface 46 of the mask screen 42 is not larger than 90°, for example, about 50° as shown in FIG. 2.

The squeegee holding member 154 has a front surface 190 which lies on a plane containing the blocking surface 176 of the bank member 160 and which is contiguous to the blocking surface 176. The arm portion 138 of the second attachment 136 is held in its forward tilted or inclined posture, and has a front surface 192 which is contiguous to the front surface 190 of the squeegee holding member 154. The front surface 192 is slightly inclined with respect to the front surface 190, but substantially lies on the above-described plane containing the blocking surface 176. The front surface 192 cooperates with the front surface 190 to provide a print-material pushing surface 194 which is contiguous to the blocking surface 176 of the bank member 160. That is, the distal end portion of the plate portion 156 of the squeegee holding member 154 and the arm portion 138 of the second attachment 136 cooperate with each other to constitute a print-material pushing portion having the print-material pushing surface 194.

In the present embodiment, the squeegee holding member 154, the retainer plate 180 and the second attachment 136 constitute first, second, third members, respectively. The squeegee holder 102 is constituted by these first, second and third members. The squeegee holding member 154, the retainer plate 180, the arm portion 148 of the second attachment 136, into which the fixing bolt 182 is screwed for fixing the plate body 164 thereto, cooperate with each other to constitute a squeegee holding portion. It may be also considered that the squeegee 100 is constituted by not only the plate body 164 and bank member 166 but also the squeegee holding member 154 to which the bank member 166 is unremovably attached in the present embodiment. It may be also considered that the first attachment 130 cooperates with the above-described first, second and third members to constitute the squeegee holder 102, or serves an adaptor for attaching the squeegee holder 102 to the vertically movable member 110, or that constitutes a part of the vertically movable member 110.

In a printing operation for printing the creamed solder 52 on the board 20 in the screen printing machine constructed as described above, the board 20 is first loaded onto the screen printing machine by the board loading apparatus, so as to be held in a predetermined position on the board supporting table 28. The board 20 is then elevated together with the board supporting table 28 by the elevating and lowering device 26, so that the print surface 22 of the board 20 is brought into contact with the lower surface 48 of the mask screen 42, whereby the mask screen 42 is superposed on the board 20. In the present embodiment, the two squeegee heads 60, 62 are alternately used for printing the creamed solder 52 on a plurality of boards 20 in series. That is, after each board 20 is printed by one of the two squeegee heads 60, 62, the printed board 20 is replaced with a new board 20, and the new board 20 is then printed by the other of the two squeegee heads 60, 62.

After the board 20 has been brought into contact with the mask screen 42, one of the two squeegee heads 60, 62, for example, the squeegee head 60 is lowered by the vertical movement device 64, such that the plate body 164 of the squeegee 100 of the squeegee head 60 is brought at its distal end portion with the upper surface 46 of the mask screen 42 with being held in a rearward inclined posture, as shown in FIG. 3. In this instance, the plate body 164 is positioned on a rear or upstream side of the board 20 as viewed in the printing direction, so that the distal end portion of the plate body 164 is brought into contact with a portion of the mask screen 42 which is located rearwardly of the board 20 in the printing direction. The plate body 164 is elastically deformed or deflected to be convexed toward the mask screen 42 such that the distal end portion of the plate body 164 is brought into close contact with the upper surface 46 of the mask screen 42 in an elastic manner. With this close contact of the distal end portion of the plate body 164 with the mask screen 42 being maintained, the squeegee holder 102 is moved by the horizontal movement device 68 in a forward direction (which is indicated by the arrow A in FIGS. 2 and 3), whereby the plate body 164 is slidably moved on the mask screen 42 while taking a rearward inclined posture. The creamed solder 52 is disposed on the upper surface 46 of the mask screen 42 in an exposed manner, while being arranged substantially in a line extending in the width direction of the mask screen 46. With sliding movement of the squeegee 100, the creamed solder 52 is wiped or raked by the plate body 164 from the upper surface 46 of the mask screen 42, so as to be pushed by the blocking surface 176 and the print-material pushing surface 194, as shown in FIG. 3. The creamed solder 52 moved together with the squeegee 100 is filled or forced into the apertures 50 of the mask screen 42.

During the sliding movement of the squeegee 100 with the blocking surface 176 and the pushing surface 194 being held in the forward inclined postures, the creamed solder 52 is forced into a wedge-shaped space which is defined by the blocking surface 176 and the upper surface 46 of the mask screen 42, owing to a friction force acting between the creamed solder 52 and the upper surface 46 of the mask screen 42. The creamed solder 52 displaced into the wedge-shaped space is forced into the apertures 50 of the mask screen 42, by the blocking surface 176 which cooperates with the upper surface 46 of the mask screen 42 to define an acute angle. The creamed solder 52 forced into the apertures 50 adheres to the board 20.

Since the squeegee 100 is slidably moved on the mask screen 42 while the plate body 164 is held in the rearward inclined posture, the plate body 164 is constantly forced onto the mask screen 42. Further, the plate body 164 which consists of a thin plate member made of a spring steel has a projecting portion projecting from the retainer plate 180, and the upper surface 172 of the projection portion of the plate body 164 is faced to the above-described interior cavity. Thus, the plate body 164 is easily deformable or deflexed to be convexed toward the mask screen 42 such that the distal end portion of the plate body 164 is brought into close contact with the upper surface 46 of the mask screen 42 in an elastic manner. That is, the projecting portion of the plate body 164 is curved to form a part-cylindrical surface having an axis which is parallel to the longitudinal direction of the plate body 164, whereby the distal end portion of the plate body 164 is held in close contact with the mask screen 42, for thereby reliably raking the creamed solder 52.

Further, since the plate body 164 made of a metallic material, it is possible to avoid a local part of the distal end portion of the plate body 164, from entering or biting into the apertures 50 of the mask screen 42, so that the creamed solder 52 which has been once received into the apertures 50 is not forced out of the apertures 50. Thus, a desired amount of the creamed solder 52 is printed on the board 20, and the creamed solder 52 printed on the board 20 is reliably formed into a desired pattern corresponding to arrangement of the apertures 50.

Although the interior cavity is formed above the projecting portion of the plate body 164 which projects forwardly from the retainer plate 180, the creamed solder 52 is prevented from being mounted onto the upper surface 172 of the plate body 164 during the sliding movement of the plate body 164 on the mask screen 42, owing to the blocking surface 176 which projects upwardly from the distal end of the upper surface 172 of the plate body 164. The bank member 166 serves as a sealing member for preventing the creamed solder 52 from entering the interior cavity, i.e. from being mounted onto the upper surface 172. Further, since the bank member 166 is fixed at its side walls 168 to the plate body 164 and the squeegee holding member 154, it is possible to reliably prevent the creamed solder 52 from entering the interior cavity through a gap between the bank member 166 and the plate body 164 and/or through a gap between the bank member 166 and the squeegee holding member 154. Thus, owing to the presence of the bank member 166 which is effective to prevent the creamed solder 52 from being mounted onto the plate body 164, it is possible to avoid a defective printing due to undesirable solidification of the creamed solder 52 on the plate body 164.

The bank member 166 thus serving for preventing mounting of the creamed solder 51 onto the plate body 164 is made of a rubber which is softer than the plate body 164 made of a spring plate. Since the bank member 166 is made of such a soft material, the bank member 166 does not impede the elastic deformation of the plate body 164. Further, in the present embodiment, the bank member 166 generally has a small thickness which facilitates its elastic deformation, so that the plate body 164 is easily deformable to be brought into contact with the mask screen 42. That is, the bank member 166 prevents mounting of the creamed solder 52 onto the plate body 164 while permitting the elastic deformation of the plate body 164.

Even if the squeegee 100 were constituted by only the plate body 164 without the bank member 166, it might be possible to enjoy the technical advantages owing to the arrangement in which the plate body 164 is held in a rearward inclined posture at least during the siding movement of the squeegee 100 along the mask screen 42 for printing the creamed solder 52 on the board 20. However, the plate body 164 requires to have a width or dimension in the squeegee moving direction which is not smaller than a predetermined amount, for enabling the plate body 164 to be elastically deformable, and the creamed solder 52 is more likely to be mounted on the plate body 164 with an increase in the width of the plate body 164, due to the absence of the bank member 166. The creamed solder 152 mounted on the plate body 164 is likely to be solidified as a result of paralyzation of flow of the solder 152. On the other hand, in the squeegee 100 constructed according to the present embodiment of the invention, the bank member 166 is provided to prevent the creamed solder 52 from being mounted on the plate body 164, so that the creamed solder 52 is reliably raked by the plate body 164 held in the reward inclined posture, thereby making it possible to print the board 20 with a desired amount of the creamed solder 52 in accordance with a desired pattern corresponding to arrangement of the apertures 50, without causing a defective printing due to solidification of the solder 52 which would be caused if the solder 52 were mounted onto the plate body 164.

The screen printing for each board 20 is completed when the squeegee head 60 has been moved to a downstream end of the mask print 42 in the squeegee moving direction. Upon completion of the screen printing for each board 20, the squeegee head 60 is elevated for separating the squeegee 100 from the mask screen 42. The board 20 on which the creamed solder 52 has been printed is lowered so as to be separated from the mask screen 42, and the board 20 is then released from the board supporting table 28 which has held the board 20 in a predetermined position during the screen printing for the board 20. The released board 20 is unloaded from the screen printing machine by the board loading apparatus. The screen printing for the next board 20 is achieved by using the squeegee head 62 in turn, such that the squeegee head 62 is moved in a direction opposite to the direction indicated by the arrow A shown in FIGS. 2 and 3, namely, in a direction opposite to the direction in which the squeegee head 60 is moved, for thereby printing the creamed solder 52 on the next board 20.

Figure 4:
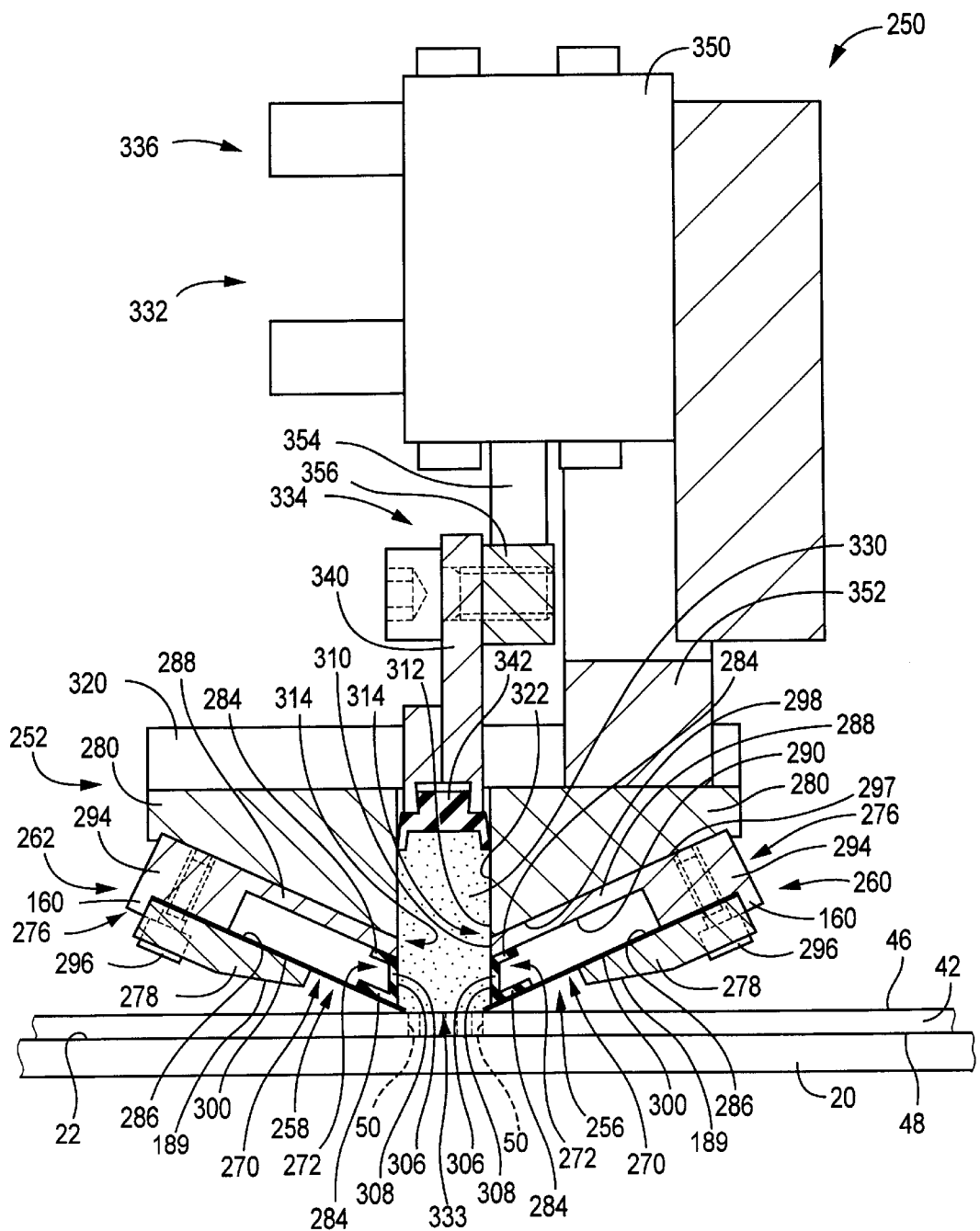
FIG. 4 is a partly cross-sectioned front view showing a squeegee device which is constructed according to another embodiment of this invention.

Referring next to FIG. 4, there will be described a second embodiment of this invention. In the above-illustrated first embodiment, the creamed solder is simply disposed on the mask screen so as to be exposed to the atmosphere (ambient space) so that the exposed solder is moved together with the squeegee so as to be forced into the apertures. The second embodiment is different from the first embodiment in that the creamed solder is accommodated in a print-material accommodating chamber so that the creamed solder enclosed by the chamber is moved together with a pair of squeegees so as to be forced into the apertures. The same reference numerals as used in the first embodiment will be used in this second embodiment, to identify the functionally corresponding or structurally similar elements, which will not be described in detail to avoid redundancy of description.

A squeegee device 250 constructed according to the second embodiment is equipped with a print head 252 which includes a pair of squeegees 256, 258, and a pair of squeegee holders 260, 262 holding the respective squeegees 256, 258. In other words, the squeegee device 250 equipped with the print head 252 including two squeegee heads, one of which is constituted by the squeegee 256 and the squeegee holder 260, and the other of which is constituted by the squeegee 258 and the squeegee holder 262. The squeegee head constituted by the squeegee 256 and the squeegee holder 260 and the other squeegee head constituted by the squeegee 258 and the squeegee holder 262 will be referred to as a right-hand squeegee head and a left-hand squeegee head, respectively, in the following description.

The print head 252 is elevated and lowered by a vertical movement device (not shown) in such a manner that the squeegee holders 260, 262 are moved between their lowered positions and elevated positions, i.e., their operating positions and non-operating positions. The squeegees 256, 258 and the squeegee holders 260, 262 are moved by a horizontal movement device (not shown) which is similar in construction to the above-described horizontal movement device 68, in a horizontal direction parallel to the upper surface 46 of the mask screen 42. The right-hand and left-hand squeegee heads are arranged symmetrically with each other with respect to a plane which is perpendicular to the upper surface 46 of the mask screen 42 and which is perpendicular to the X-axis direction, i.e., the squeegee moving direction. Since these two squeegee heads are identical in construction with each other, only the right-hand squeegee head provided by the squeegee 256 and squeegee holder 260 will be described below in detail.

Like the above-described squeegee 100, the squeegee 256 includes a plate body 270 made of a spring steel, and a bank member 272. Like the above-described squeegee holder 102, the squeegee holder 260 includes the first member in the form of a squeegee holding member 276, the second member in the form of a retainer plate 278, and the third member in the form of an attachment 280. Like the above-described bank member 166, the bank member 272 made of a rubber is fixed, at its pair of side walls 284, to the distal end portion of an upper surface 286 of the plate body 270 and the distal end portion of a lower surface 290 of a plate portion 288 of the squeegee holding member 276, respectively. The squeegee 256 is gripped at the proximal end portion of the plate body 270 by and between a plate-body seat portion 294 of the squeegee holding member 276 and the retainer plate 278 which are positioned on respective upper and lower sides of the plate body 270. The squeegee 256, together with the squeegee holding member 276 and the retainer plate 278, is fixed to the attachment 280 by a fixing bolt 296, as shown in FIG. 4.

The plate portion 288 of the squeegee holding member 276 is held in close contact at its upper surface 297 with a lower surface 298 of the attachment 280. With the squeegee 256 being fixed relative to the attachment 280 whose lower surface 298 takes a rearward inclined posture, the plate body 270 of the squeegee 256 is held in a rearward inclined posture. In the present embodiment, a lower surface 300 of the plate body 270 cooperates with the upper surface 46 of the mask screen 42 to define an angle which is about 25°.

A blocking wall 306 of the bank member 272 extends upwardly from the distal end portion of the upper surface 286 of the plate body 270, and cooperates with the upper surface 286 of the plate body 270 to define an acute angle. A blocking surface 308 provided by a front surface of the blocking wall 306 is held in perpendicular to the upper surface 46 of the mask screen 42. A front surface 310 provided by the distal end surface of the plate portion 288 of the squeegee holding member 276 lies on a plane on which the blocking surface 308 also lies. A front surface 312 of the attachment 280 also lies on this plane on which the blocking surface 308 and the front surface 310 lie. The front surfaces 310, 312 cooperate with each other to provide a print-material pushing surface 314 which is held perpendicular to the upper surface 46 of the mask screen 42. While the distal end portion of the plate body 270 protrudes forwardly from the blocking surface 308 in the illustration of FIG. 4, the distal end portion of the plate body 270 may protrude from the blocking surface 308 over a distance not so large as illustrated in FIG. 4, so that the distal end of the plate body 270 lies on the above-described plane which contains the front surfaces 310, 312 and the blocking surface 308.

The pair of squeegees 256, 258 each of which is constructed as described above are held by the respective squeegee holders 260, 262, such that the blocking surface 308 and the print-material pushing surface 314 of the right-hand squeegee head are opposed and parallel to those of the left-hand squeegee head. Between the blocking surface 308 and the print-material pushing surface 314 of the right-hand squeegee head and those of the left-hand squeegee head, there is formed an elongated space which in elongated in the width direction of the mask screen 42. This elongated space is closed at its longitudinally opposite opening ends by a pair of side walls 320. That is, the squeegees 256, 258, the squeegee holders 260, 262 and the pair of side walls 320 cooperate with each other to define a print-material accommodating chamber 322. The blocking surface 308 and the print-material pushing surface 314 of each of the right-hand and left-hand squeegee heads serve as walls of the chamber 322 or surfaces defining the chamber 322.

The print material in the form of creamed solder 330 is provided to be accommodated in the print-material accommodating chamber 322. The creamed solder 330 is extruded by a pressure applying device in the form of an extruding device 332, from the chamber 322 through an opening 333 of the chamber 322. The extruding device 332 includes an extruding head 334 and an extruding-head driving device 336. The extruding head 334 is constituted by an elongated plate member 340 and a rubber-made sealing member 342 which is held by the elongated plate member 340, and fitted in the chamber 322 such that the extruding head 334 is vertically movable. The sealing member 342 is unremovably engaged with an lower end portion of the elongated plate member 340. The sealing member 342 protrudes outwardly from the periphery of the elongated plate member 340 in the width and longitudinal directions of the elongated plate member 340 so as to be brought into contact with the walls of the chamber 322, i.e., the print-material pushing surfaces 314 and the surfaces of the side walls 320, for thereby sealing the chamber 322.

The extruding-head driving device 336 includes a drive source in the from of a plurality of cylinders 350. In the present embodiment, the extruding-head driving device 336 includes two cylinders 350 (only one of them is shown in FIG. 4) each consisting of an air cylinder. Each cylinder 350 is attached to a cylinder attachment 352 which is fixed to the side wall or walls 320, such that its piston rod 354 is extensible downwardly. The cylinders 350 are elevated and lowered together with the squeegees 256, 258 and the squeegee holders 260, 262 by a vertical movement device (not shown). The piston rod 354 of each cylinder 350 is connected to a connecting plate member 356 which is fixed to the elongated plate member 340 of the extruding head 334, so that the piston rod 354 is mechanically linked with the extruding head 334.

In a printing operation for printing the creamed solder 330 on the board 20 with the screen printing machine of the present embodiment, the print head 252 is lowered such that the squeegees 256, 258 are brought into contact with the upper surface 46 of the mask screen 42. In this instance, the extruding head 334 is lowered to apply an extrusion pressure to the creamed solder 330 which is accommodated in the print-material accommodating chamber 322. The opening 333 of the chamber 322 is closed by the mask screen 42, whereby the extrusion pressure is suitably applied to the creamed solder 330 which remains in the chamber 322 without being extruded from the chamber 322.

With the creamed solder 330 being pressurized by the extruding head 334, the print head 252 is moved by the horizontal movement device in a direction which is parallel to the upper surface 46 of the mask screen 42 and which is perpendicular to the blocking surfaces 308. The creamed solder 330 accommodated in the chamber 322 is prevented by one of the squeegees 256, 258 which is positioned on a forward side of the other of the squeegees 256, 258 as viewed in the printing direction, i.e., the squeegee moving direction, from flowing out of the chamber 322, while at the same time the creamed solder 330 is wiped or raked from the upper surface 46 of the mask screen 42 by the other of the squeegees 256, 258 which is positioned rearwardly of the above-described one of the squeegees 256, 258. Thus, the creamed solder 330 is held accommodated in the chamber 322, so as to be moved together with the chamber 322 on the mask screen 42. Each time the chamber 322 is opposed to one of apertures 50 of the mask screen 42, a part of the creamed solder 330 corresponding to the opposed aperture 50 is forced into the aperture 50, while the other part of the creamed solder 330 is raked by the above-described other of the squeegees 256, 258. The creamed solder 330 forced into each aperture 50 then adheres to the board 20. The two cylinders 350 are activated in a synchronized manner, whereby their respective piston rods 354 are lowered simultaneously with each other. Since these piston rods 354 are connected to each other through the connecting plate member 356, the extruding head 334 is not rotatable about an axis that is parallel to the printing direction, so that the extruding head 334 is held in a horizontal posture during its downward movement, whereby the extrusion pressure is evenly distributed over the entirety of the creamed solder 330 in the width direction of mask screen 42.

When the print head 252 reaches a longitudinal end of the mask screen 42, namely, when the application of the creamed solder 330 to each board 20 is completed, the horizontal movement of the print head 252 relative to the mask screen 42 is suspended. For printing the creamed solder 330 on the next board 20, the print head 252 is moved in a direction opposite to the direction in which the print head 252 has been moved for printing the creamed solder 330 on the last board 20. During the reciprocation of the print head 252 and the mask screen 42 relative to each other, a rear side one of the squeegees 256, 258 serves to wipe or rake the creamed solder 330 from the upper surface 46 of the mask screen 42. The squeegee 256 or 258 serving to rake the solder 330 is slidably moved on the mask screen 42 with being held in a rearward inclined posture, so that the raking squeegee 256 or 285 reliably rakes the creamed solder 330 from the mask screen 42, without the plate body 270 made of a spring steel entering or biting into the apertures 50, whereby the creamed solder 330 is printed on the board 20 with high stability. Further, the bank member 272 fixed to the distal end portion of the plate body 270 serves to prevent the creamed solder 330 from being mounted onto the plate body 270, for thereby avoiding a defective printing.

In the above-illustrated embodiments, the bank members 166, 272 are fixed to the respective squeegee holding members 154, 276. However, the bank members 166, 272 may be simply held in close contact with the respective squeegee holding members 154, 276, without being fixed to the respective members 154, 276, so that the squeegee holding member is used as a common squeegee holding member for a plurality of squeegees, without being replaced with other squeegee holding member even in replacement of the squeegee with other squeegee.

It should be noted that the principle of the present invention described above is applicable to also a squeegee and a squeegee device for printing a print material on an object which is other than a printed circuit board.

While the presently preferred embodiments of this invention have been described above in detail by reference to the accompanying drawings, from illustrative purpose only, it is to be further understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. A squeegee for forcing a print material into apertures of a mask screen which is disposed on an object, while being moved relative to said mask screen in a printing direction for printing said print material on said object, said squeegee comprising:

a plate body movable relative to said mask screen in sliding contact thereof with one of opposite surfaces of said mask screen which is remote from said object, while taking a rearward inclined posture in which said plate body is inclined such that a distal end portion of said plate body is positioned on a forward side of a proximal end portion of said plate body as viewed in said printing direction; and a bank portion provided on one of opposite surfaces of said plate body which is remote from said mask screen, and having a blocking surface which projects from said distal end portion of said plate body in a direction away from said mask screen and which blocks said print material to prevent said print material from being mounted on said plate body during relative movement of said plate body and said mask screen in said printing direction, said bank portion being made of a material softer than a material of said plate body.

2. A squeegee according to claim 1, wherein said bank portion has a blocking wall which projects from said distal end portion of said plate body in a direction away from said mask screen, and wherein said blocking surface is provided by a surface of said blocking wall.

3. A squeegee according to claim 1, wherein said plate body is made of a metallic material.

4. A squeegee according to claim 1, wherein said bank portion is made of a rubber.

5. A squeegee according to claim 1, wherein said bank portion is made of a material having substantially the same degree of elastic deformability as that of a rubber.

6. A squeegee device comprising:

the squeegee defined in claim 1;

a squeegee holder which holds said squeegee such that the other of said opposite surfaces of said plate body cooperates with said one of said opposite surfaces of said mask screen to define an angle not larger than 45°, and such that said blocking surface of said bank portion cooperates with said one of said opposite surfaces of said mask screen to define an angle not larger than 90°; and a moving device which is capable of moving said squeegee holder and said mask screen relative to each other while maintaining contact of said squeegee with said one of said opposite surfaces of said mask screen.

7. A squeegee device according to claim 6, further comprising a second moving device in addition to said moving device as a first moving device, said second moving device being capable of moving said squeegee holder between an operating position in which said squeegee is brought into contact with said one of said opposite surfaces of said mask screen, and a non-operating position in which said squeegee is separated from said one of said opposite surfaces of said mask screen.

8. A squeegee device according to claim 6, wherein said squeegee holder includes:

a squeegee holding portion which holds said proximal end portion of said plate body; and a print-material pushing portion which is held in close contact with one of opposite ends of said bank portion that is remote from said plate body, and which has a print-material pushing surface that is contiguous to said blocking surface of said bank portion.

9. A squeegee device comprising:

a squeegee for forcing a print material into apertures of a mask screen which is disposed on an object, so as to print said print material on said object, said squeegee including: (a) a plate body movable relative to said mask screen in sliding contact thereof with one of opposite surfaces of said mask screen which is remote from said object, while taking a rearward inclined posture in which said plate body is inclined such that a distal end portion of said plate body is positioned on a forward side of a proximal end portion of said plate body as viewed in a squeegee moving direction in which said plate body is moved relative to said mask screen; and (b) a bank portion provided on one of opposite surfaces of said plate body which is remote from said mask screen, and having a blocking surface which projects from said distal end portion of said plate body in a direction away from said mask screen, said bank portion being made of a material softer than a material of said plate body;

a squeegee holder which holds said squeegee such that the other of said opposite surfaces of said plate body cooperates with said one of said opposite surfaces of said mask screen to define an angle not larger than 45°, and such that said blocking surface of said bank portion cooperates with said one of said opposite surfaces of said mask screen to define an angle not larger than 90°; and a moving device which is capable of moving said squeegee holder and said mask screen relative to each other while maintaining contact of said squeegee with said one of said opposite surfaces of said mask screen, wherein said bank portion of said squeegee has a blocking wall which projects from said distal end portion of said plate body in a direction away from said mask screen, and which has a surface forming said blocking surface, wherein said squeegee holder includes:

a first member including a plate portion extending substantially in parallel with said plate body, and a plate-body seat portion projecting from one of opposite end portions of said plate portion, which one is positioned rearward of the other of said opposite end portions of said plate portion as viewed in said squeegee moving direction, toward said mask screen; and a second member which is removably attached to said first member and which cooperates with said first member to grip said proximal end portion of said plate body, wherein said plate portion of said first member is held in close contact at the other of said opposite end portions of said plate portion with an end portion of said blocking wall, while said proximal end portion of said plate body is gripped between said first and second members, and wherein said plate body, said blocking wall and said plate portion cooperate with said plate-body seat portion to constitute a hollow body which has a square shape in a cross section thereof.

10. A squeegee device according to claim 9, wherein said squeegee holder further includes a third member which holds said first member and is held in close contact with one of opposite surfaces of said plate portion that is remote from said blocking wall, and wherein said third member cooperates with said first member to form a print-material pushing surface that is adjacent to said blocking surface of said bank portion.

11. A squeegee device comprising:

a pair of squeegees each of which is constituted by a squeegee for forcing a print material into apertures of a mask screen which is disposed on an object, so as to print said print material on said object, said squeegee including: (a) a plate body movable relative to said mask screen in sliding contact thereof with one of opposite surfaces of said mask screen which is remote from said object, while taking a rearward inclined posture in which said plate body is inclined such that a distal end portion of said plate body is positioned on a forward side of a proximal end portion of said plate body as viewed in a squeegee moving direction in which said plate body is moved relative to said mask screen; and (b) a bank portion provided on one of opposite surfaces of said plate body which is remote from said mask screen, and having a blocking surface which projects from said distal end portion of said plate body in a direction away from said mask screen, said bank portion being made of a material softer than a material of said plate body;

a squeegee holder which holds said pair of squeegees such that the blocking surfaces of the respective squeegees are opposed and parallel to each other, and such that the other of said opposite surfaces of said plate body of each of said pair of squeegees cooperates with said one of said opposite surfaces of said mask screen to define an angle not larger than 45°; and a moving device which is capable of reciprocating said squeegee holder and said mask screen relative to each other in directions perpendicular to said blocking surfaces of said respective squeegees, while maintaining contact of each of said pair of squeegees with said one of said opposite surfaces of said mask screen.

12. A squeegee device according to claim 11, further comprising a pressure applying device capable of applying a pressure to said print material which is accommodated in a space between said blocking surfaces of said respective squeegees.

13. A squeegee device according to claim 11, wherein said plate body of each of said pair of squeegees includes, in said distal end portion, an extreme distal end portion which projects from said blocking surface of a corresponding one of said pair of squeegees in a direction away from said proximal end portion.

14. A squeegee device comprising:

a squeegee for forcing a print material into apertures of a mask screen which is disposed on an object, while being moved relative to said mask screen in a printing direction for printing said print material on said object, said squeegee including: (a) a plate body movable relative to said mask screen in sliding contact thereof with one of opposite surfaces of said mask screen which is remote from said object, while taking a rearward inclined posture in which said plate body is inclined such that a distal end portion of said plate body is positioned on a forward side of a proximal end portion of said plate body as viewed in said printing direction; and (b) a bank portion provided on one of opposite surfaces of said plate body which is remote from said mask screen, and having a blocking surface which projects from said distal end portion of said plate body in a direction away from said mask screen, said bank portion being made of a material softer than a material of said plate body; and a moving device which moves said squeegee and said mask screen relative to each other in said printing direction while said print material is being printed on said object.

15. A squeegee device comprising:

a squeegee for forcing a print material into apertures of a mask screen which is disposed on an object, while being moved relative to said mask screen in a printing direction for printing said print material on said object, said squeegee including: (a) a plate body movable relative to said mask screen in sliding contact thereof with one of opposite surfaces of said mask screen which is remote from said object, while taking a rearward inclined posture in which said plate body is inclined such that a distal end portion of said plate body is positioned on a forward side of a proximal end portion of said plate body as viewed in said printing direction; and (b) a bank portion provided on one of opposite surfaces of said plate body which is remote from said mask screen, and having a blocking surface which projects from said distal end portion of said plate body in a direction away from said mask screen, said bank portion being made of a material softer than a material of said plate body; and a squeegee holder which holds said squeegee such that the other of said opposite surfaces of said plate body cooperates with said one of said opposite surfaces of said mask screen to define an angle not larger than 45°, and such that said blocking surface of said bank portion cooperates with said one of said opposite surfaces of said mask screen to define an acute angle.

* * * * *